Figure 1:
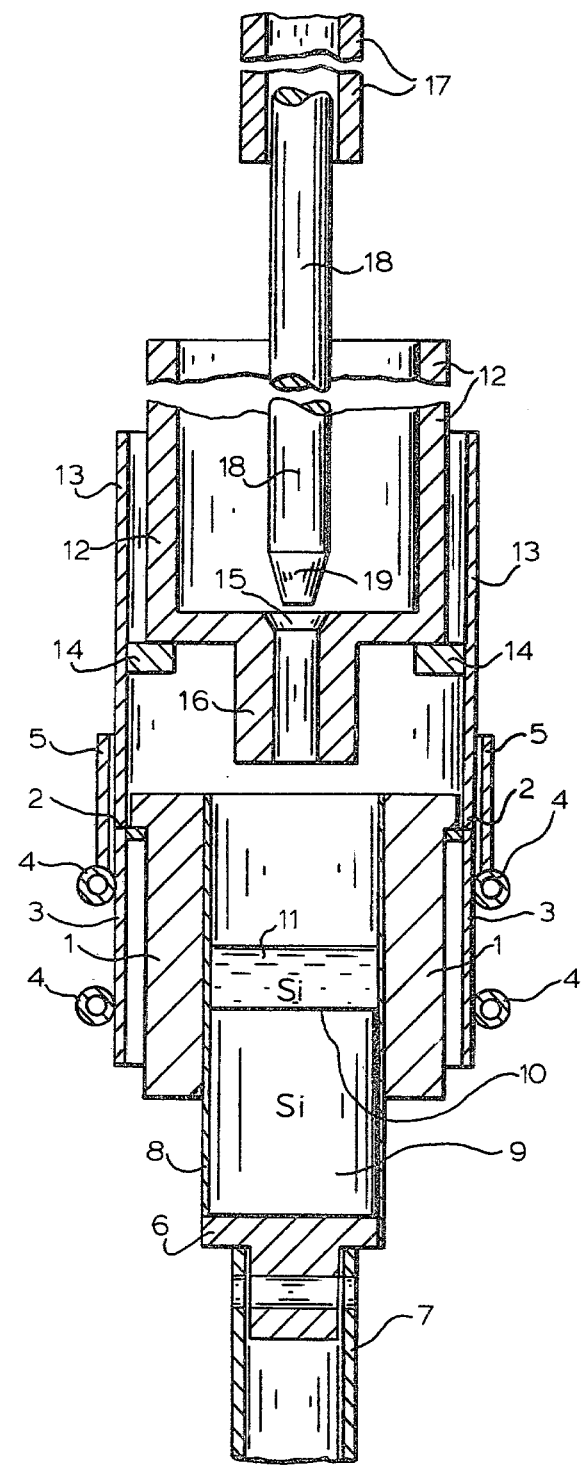

United States Patent [19]

Helmreich et al.

[11] 4,312,700
[45] Jan. 26, 1982

[54] METHOD FOR MAKING SILICON RODS

[75] Inventors: Dieter Helmreich, Burghausen; Erhard Sirtl, Marktl; Theo Zöllner, Burghausen, all of Fed. Rep. of Germany

[73] Assignee: Helictronic Forschungs- und Entwicklungs- Gesellschaft fur Solarzellen-Grundstoffe mbH, Burghausen, Fed. Rep. of Germany

[21] Appl. No.: 157,707

[22] Filed: Jun. 9, 1980

[30] Foreign Application Priority Data

Jun. 26, 1979 [DE] Fed. Rep. of Germany ....... 2925679

[51] Int. Cl.³ .................... C30B 11/08; C30B 29/06; C30B 35/00
[52] U.S. Cl. .................... 156/616 R; 156/DIG. 64; 156/DIG. 83; 422/248
[58] Field of Search ...... 156/616 R, 616 A, DIG. 64, 156/DIG. 83; 422/248, 253

[56] References Cited

U.S. PATENT DOCUMENTS

| 2,475,810 | 7/1949 | Theuerer | 156/616 |
| 3,267,529 | 8/1966 | Gruber et al. | 156/616 |
| 3,660,298 | 5/1972 | McClincy et al. | 423/350 |
| 3,745,043 | 7/1973 | Bradley | 423/350 |
| 3,759,310 | 9/1973 | Barrow et al. | 156/616 |

FOREIGN PATENT DOCUMENTS

| 2722784 | 11/1978 | Fed. Rep. of Germany | 156/616 |
| 954849 | 4/1964 | United Kingdom | 156/616 |

Primary Examiner—Gregory N. Clements
Attorney, Agent, or Firm—Allison C. Collard; Thomas M. Galgano

[57] ABSTRACT

To make solar energy competitive, as compared against other sources of energy, inexpensive solar cells are required. To accomplish this goal, a method is provided which enables one to produce silicon rods having a columnar structure made of monocrystalline zones with preferential crystallographic orientation. This is effected by feeding a silicon melt into a crystallization chamber having a vertically movable cooled bottom face under the influence of a temperature gradient directed parallel to the rod axis, so that the rods can be made continuously or semicontinuously with high drawing speeds.

8 Claims, 2 Drawing Figures

METHOD FOR MAKING SILICON RODS

The invention relates to a method for making silicon rods. More particularly, it relates to a method for making silicon rods having a columnar structure made of monocrystalline crystal zones having a preferential crystallographic orientation.

Due to the increased scarcity and cost of fossil fuels, solar cells made of silicon which permit the direct conversion of solar energy into electrical energy have become increasingly important. While this type of energy generation by using solar cells made of monocrystalline silicon is already prevalent in the area of satellite technology, such silicon solar cells are still too expensive to be used for terrestial applications.

From the German laid open Pat. No. 2,508,803, novel polycrystalline plate-like silicon crystals and a method for making the same are known which, after the required doping, may be used as a base material for solar cells with a degree of effectiveness of about 10%. In order that such solar cells can compete with commonly known energy sources, they must be produced much less expensively and this can only be realized by providing a production method which produces a high rate of units per unit time. It is also known to make relatively large silicon rods by casting, for example. However, such silicon rods do not have a preferential crystallographic orientation after solidification, which is essential when using the material as the base material for solar cells with a high degree of effectiveness.

For example, in accordance with British Pat. No. 954,849, a quartz pipe which is closed at the bottom and embedded in a heat insulating material is filled with silicon. The molten liquid silicon is constantly fed from above and, therefore, the silicon solidifies from below. However, the crystal growth starts on the sidewalls of the quartz pipe, since a heat discharge is only possible through the quartz wall. Moreover, such a method would not be suitable, even if it would result in silicon having the required crystal structure; the material would not be suitable as a solar cell base material, because it would be too expensive. Due to the heat insulation of the quartz mold, the solidfying speed as well as the crystallization speed of the silicon would be considerably delayed. Furthermore, additional expenses are incurred for the required quartz molds. Such quartz molds can be used only once when making large rods due to the different expansion coefficients of quartz and solid silicon which, as is very well known, undergoes a volume enlargement of about 10%. The British patent mentions that by coating the inner wall of the quartz mold with carbon a wetting between quartz and silicon may be prevented, so that the quartz mold may be removed after the silicon is solidified. However, this is only achieved when the silicon solidifies very slowly, and only with rods which have a small rod cross section of about 2 cm, in accordance with the example stated in the above-mentioned British patent.

It is therefore an object of the invention to provide polycrystalline silicon having the required crystal structure in the form of large rods which can be made at a high rate of speed.

This object of the invention is obtained by a method which is characterized in that silicon is removed continuously or cyclically from a silicon reservoir and is fed into a crystallization chamber, wherein it rests upon a vertically movable support which, in its horizontal dimensions, corresponds at least to the cross-sectional dimension or face of the rod to be made. The silicon is fed in such a quantity that a molten deposit is maintained above the solidifying silicon during the crystal growth under the influence of a temperature gradient which is directed parallel to the rod; the weight quantity of the molten deposit corresponding to 0.1 to 5 times that of the silicon which crystallizes in a downward direction per minute.

For receiving the silicon reservoir, crucibles are suitable, for example. The surface of the crucible which comes into contact with the silicon melt during the additional loading or charging operation is made of reactionbound or heat-impressed silicon nitride, quartz, or glass carbon, or pore-tight graphite which is formed, for example, by impregnation of a graphite surface with a fine carbon-decomposing organic compound which closes the pores in a subsequent heat treatment. Furthermore, graphite crucibles may be used, the insides of which are coated with silicon carbide and/or silicon nitride, in accordance with the method described in German Laid Open Patent No. 2,739,258. These crucibles may be used as a crucible for the supply melt.

It is particularly advantageous that, for the additional loading or charging of silicon, the surface coating of the charging vessels which comes into contact with the silicon melt is provided with a protective melt. In such cases inexpensive coarse-pore graphite may be used, so that these vessels may be reused without any question.

These protective melts have melting points which are beneath the melting point of silicon, i.e., about 800° to 1400° C., preferably 1100° to 1200° C. Generally, compounds suitable for these protective melts have a vapor pressure which in the temperature range of about 1400° to 1500° C. is very low. Furthermore, such melts should not have any elements or impurities or should not be able to disseminate any elements or impurities to the silicon, i.e., elements or impurities which could be considered to be lifetime killers for the minority carriers in silicon. Also, the solubility of the components which comprise the protective melt and their impurities in the silicon melt should be very low, i.e., the protective melt should not be admixable with silicon. In other words, a phase boundary should form between these two systems.

In particular, melts made of alkaline earth fluorides in a mixture of 30 to 90 mole percent of earth alkaline silicates are particularly suitable as protective melts, as long as the melting point of the compound selected within these stated limits is below the melting point of silicon. In particular, the fluorides and silicates of the alkaline earth elements which may be used include, e.g., magnesium, calcium, strontium and barium, with calcium and magnesium compounds being preferred due to their lower cost. For example, mixtures of magnesium fluoride with calcium silicate or magnesium fluoride with magnesium silicate, mixtures of calcium fluoride with magnesium silicate, as well as mixtures of calcium fluoride and calcium silicate are preferably used, because they have a considerably lower steam or vapor pressure than magnesium fluoride. For example, especially suitable protective melts are melts having a melting point which is in the preferred range of about 1100° to 1200° C., e.g., mixtures having about 40 to 60 mole percent calcium fluoride.

In accordance with the inventive method, two or more crucibles may be arranged in a parallel fashion with respect to each other to serve as silicon reservoirs, so that after emptying one crucible one can switch immediately to a second one having the same doped silicon. The feeding of the silicon melt, the silicon granulate or powder into the crystallization chamber may be carried out, for example, through a supply pipe or chute. Preferably, short paths should be provided so as to assure a substantially uniform temperature constant in case of the use of an inflowing liquid silicon melt.

For obtaining a uniform feeding of silicon from the silicon reservoir into the crystallization chamber, the melting crucible for the supply melt may be provided with a preferably rotatable and heated displacement element movable in an axial direction for feeding the liquid melt. The displacement element is so dimensioned that it successively and quantitatively displaces the melt when immersed in the crucible. In this system, the uniform supply of the melt into the crystallization chamber may be carried out, for example, with a second smaller displacement element in the bottom of the first displacement element or in the overflow.

The displacement element or elements are made of the same materials as those previously mentioned as being suitable for the crucibles. In a given device, the crucible used and the displacement elements which are immersed into the silicon melt need not necessarily be made of the same material. The size of the crucible for the silicon reservoir depends on whether it is used as an interim container for receiving solid or liquid silicon in a parallel-running continuous purifying process, or whether the method is operated continuously or semi-continuously. In the latter case, the crucible would have a dimension, so as to receive a silicon quantity which is sufficient to produce one rod. During the time in which the silicon rod is being grown, the crucible may be filled up again to permit the making of a second silicon rod, or it may be exchanged for an already filled second crucible.

In accordance with a preferred embodiment of the invention, this additional charging is carried out by a crucible which is positioned above the crystallization chamber having an opening in the bottom thereof, which can be closed by means of a rotatable vertically-movable stopper rod. The opening in the bottom of the crucible is essentially in the form of a downwardly-tapering frustoconical bore which can be closed or opened by means of a correspondingly shaped cone-like end of the stopper rod, or may be reduced in size by adjustment of a defined annular slot between the rod and the bore. In the case of an additional charging of liquid melt, the interior surface of the crucible together with the discharge opening and the stopper rod are impregnated with one of the aforementioned protective melts so as to assure their reusability.

In accordance with a preferred embodiment, the crystallization chamber consists of a drawing pipe, the hollow cross section of which corresponds to the intended shape, i.e., the desired cross section of the silicon rod to be made. Therefore, the hollow cross section may not only be round in profile but it may also be polygonal; for example, it may have a rectangular or square profile. For example, if a square cross section is chosen with an edge side or length of 10 cm, silicon rods are obtained which may be cut perpendicularly with respect to the longitudinal axis thereof so that discs for making solar cells are obtained, which have the technically favorable size of about 100 cm$^2$. The polygonal embodiment is advantageous over the round shape because the silicon disks obtained can be mounted in a tighter adjacent arrangement when making solar generators.

The crystallization chamber is closed at its bottom by means of a coolable support, e.g., made of graphite, which is mounted on a vertically movable shaft. The support in its horizontal dimensions corresponds to the shape of the crystallization chamber and corresponds at least to the desired cross-sectional face of the silicon rod to be made.

When choosing a suitable material for making the crystallization chamber care should be taken that the rod being drawn is wetted with protective melts as heretofore mentioned. Suitable materials are, for example, silicon carbide, silicon nitride, graphite or pore-coated graphite. When choosing suitable protective melts for the crystallization chamber the general statement can be made that the crystallization chamber must be wetted more by the protective melt than by the silicon. This results in a relatively high surface tension of this protective melt layer, so that a sufficient border tension is provided between this layer and the adjacent silicon. On the other hand, the viscosity of the protective melt should not be too high, so that a thin melt film in the dimension of about 10 to 20 $\mu$m can form. These criterias are met by the heretofore described protective melts, with the calcium silicate/-fluoride slags having been proven to work best.

Perpendicular to the growth front, an upwardly-directed temperature gradient is appropriately applied so as to obtain a directed solidifying of the silicon for forming a columnar structure made of monocrystalline crystal zones with preferential crystallographic orientation. For example, a resistance heater may be installed for heating the crystallization chamber for making rods having comparably small cross sections, while for rods with larger cross sections of 5 cm or more a medium frequency heater with a large stray field is especially well suited. Principally, the heating may be carried out directly or indirectly, for example, by the radiated heat of inductively-heated graphite plates. Basically, the upper portion of the crystallization chamber is heated to temperatures of about 1440° C., i.e., above the melting point of silicon and about to the temperature of the fed silicon melt, while the lower end of the crystallization chamber is maintained at a temperature of about 1300° to 1380° C.

During the growing of the semiconductor rod, the cooled support and the crystallizing semiconductor rod are continuously drawn downwardly. Preferably, at the start of the crystal growing, a plate-like seed crystal is placed onto the cooled support which, in its horizontal dimensions, substantially corresponds to the desired cross-sectional face of the silicon rod to be made. To maintain a constant growth structure and to assure generation of a columnar structure having monocrystalline crystal zones of preferred orientation perpendicular to the crystallization front, a seed plate is used as the plate-like seed crystal having a columnar structure parallel to the desired growth direction, i.e., having a twinning plane parallel to the growth direction. After the discharge of the silicon rod from the crystallization chamber, it is advantageous to subject the rod to a subsequent heating zone having a temperature of about 1150° to 1300° C. before effecting further cooling. This heating zone should correspond in its length to about the cross section of the silicon rod. This heating zone may be an integral part of the crystallization chamber; the actual crystallization chamber is to be understood to mean the part which in the aforementioned paragraph has the previously mentioned temperatures. The silicon rod which is continuously discharged from the crystallization chamber during the growth process is cooled by suitable means, for example, by means of a set of annular jets arranged around the rod from which an inert cooling gas, for example, argon or nitrogen is applied. Thereby, the cooling is so adjusted that the silicon rod has a temperature of about 700° to 800° C. after having travelled a distance of 30 to 40 cm from the crystallization front; the average temperature gradient should be 5° to 25° C. per cm along this path. Once the rod is cooled to a temperature of 600° to 700° C., the plastic range is achieved and further cooling is no longer critical.

At any rate the crystallization front is still in the preferably pipe-like crystallization chamber, whereby a dripping of the melting zone does not occur as, for example, in the crucible-free zone drawing or similar methods. Furthermore, the drawing process may be interrupted at any given moment by freezing the silicon in the melt-protected crystallization chamber, and may again be started by merely adjusting the temperature to the required level.

The position of the crystallization front may be detected in a simple manner, for example, by means of ultrasonic measurements or by a set of temperature probes which are inserted into the wall of the crystallization chamber, and the resulting curves which may be read. A calculator may compare these values with defined nominal values and control the required temperatures necessary for the crystal growth. Such control dimensions are in addition to the drawing speed, for example, the adjusted temperature gradient, i.e., the cooling of the silicon rod which discharges from the crystallization chamber, the heating and thereby the temperature distribution along the crystallization chamber, as well as the temperature of the additionally fed silicon and the melt deposit above the solidified crystallization front.

The silicon which is used in the method may be fed in liquid form or in solid form. For example, in accordance with the method disclosed in German laid open Patent No. 2,722,783, the silicon granulate may be applied directly into the melt deposit above the solidified crystallization front, without first melting the silicon granulate. In this purification method a mechanical stress is superimposed on the metallurgically pure silicon which has a silicon content of over 95% by weight, by leaching with an acid solution which does not attack the silicon, so as to obtain a continued reduction of the granulate. The silicon which is obtained after this purifying process can either be immediately used, as described heretofore, or if the requirements with respect to the purity of the silicon are higher, it may be subjected to a further subsequent purification process, as described in German laid open patent application No. 2,722,784, for example.

In accordance with the method described in this German application, a rotating roller which is made of a material which is inert with respect to silicon and which is cooled to below the melting point of silicon is immersed into the silicon to be purified so that silicon solidifies on the surface of the roller. When discharging from the melt on the roller, this solidified silicon again melts after passing through a subsequent heated zone having a temperature above the melting point of silicon and it can then be fed back to the crystallization chamber in accordance with the inventive method. However, the inventive method may be carried out with any other commercially available pure silicon and may be combined with other known purification processes.

If the silicon which is used in the inventive method and which may be present in granulated or liquid form is not yet doped, or if the dope content deviates from the desired doping as required for making polycrystalline silicon rods, the desired doping quantity should be applied before introduction into the crystallization chamber. Suitable doping materials are aluminum, boron, gallium, indium, phosphorus, arsenic, or antimony. For making a solar cell base material, boron or phosphorous doping is generally preferred.

The protective melt for the crystallization chamber and, if need be, for the recharging chamber with the stopper rod, is also continuously added to the silicon. This is because it is partly removed from the system together with the crystallized rod.

The crystallized rod may be cut off at a predetermined length without interrupting the method, or the method may be stopped for a short time by freezing. Due to its impregnation with the protective melt, fracturing of the directed solidification in the crystallization chamber is not possible.

The inventive method has numerous advantages over the hitherto known casting methods for making solar cell base material. It can be carried out continuously and no impurities are introduced due to the protective melt-protected crystallization chamber in contrast to the known casting method. Furthermore, the crystallization times are considerably shortened, since there is always a minimum quantity of melt present in the crystallization chamber above the already solidified silicon, so that the heat can be easily disseminated over the rod.

These and other related objects and features of the present invention will become apparent from the following detailed description, considered in connection with the accompanying drawings, which disclose several embodiments of the invention. It is to be understood, however, that the drawings are designed for the purpose of illustration only, and not as a definition of the limits of the invention.

Figure 2:
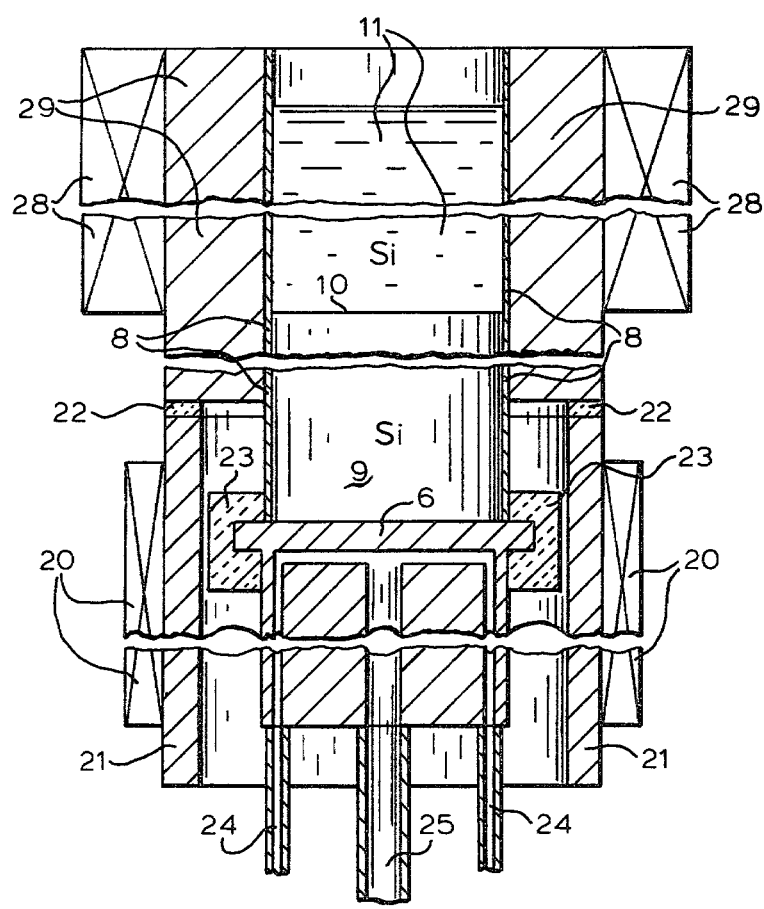

In the drawings, wherein similar reference characters denote similar elements throughout the several views:

FIG. 1 is a schematically-illustrated, cross-sectional view of a pipe-like crystallization chamber having a crucible mounted on top thereof provided with a stopper rod for additional silicon charging which is used in association with the novel method of the present invention; and FIG. 2 is a schematically-illustrated, cross-sectional view of another crystallization chamber, having a subsequent heating zone.

Referring now in detail to the drawings, a pipe-like crystallization chamber 1 is shown in FIG. 1 which is made of graphite, for example. Crystallization chamber 1 is inserted by means of retainers 2 made of, e.g., electrically-insulating quartz, into the center of an induction heating coil 3 having an associated water cooling pipe 4. An additional quartz ring 5 serves solely to facilitate adjustment of the upper device elements. Chamber 1 has a bottom plate 6 made of graphite which is mounted on a vertically movable pipe 7 made, e.g., of quartz through which a cooling medium such as air, for example, can flow.

A thin protective film 8 permits a problem-free drawing of the silicon rod 9 which grows in a crystalline manner on cooled plate 6 and which can be readily removed from crystallization chamber 1, while solid or liquid silicon may be added from the silicon reservoir of a charging or loading device or crucible 12 which is made, for example, of graphite. Loading crucible 12 which, for example, is retained on a quartz ring 14 mounted in a tubular quartz element 13 is provided with a downwardly conically-tapered discharge opening 15 which runs into a lower feed pipe 16. Discharge opening 15 may be opened or closed by a stopper rod 18 made of graphite which has a correspondingly conically-tapered end 19 and which is rotatably driven by a drive shaft 17. Rod 18 is also vertically movable so that it may completely close opening 15 or cooperate therewith to define an annular slot which affords a partial opening thereof.

FIG. 2 illustrates a crystallization chamber 29 encompassed by a heating device 28. A silicon rod 9 is disposed in crystallization chamber 29 separated therefrom by the protective film 8. A silicon deposit 11 is disposed above the crystallized portion 10. The silicon rod is drawn downwardly into a subsequent heating zone, consisting of a graphite pipe 21 encompassed by a resistance heating element 20. Graphite pipe 21 is separated from crystallization chamber 19 by an insulating ring 22. The cooled bottom plate 6 is protected against the heat radiation from graphite pipe 21 by a heat insulation ring 23 made, for example, of quartz or asbestos. Bottom plate 6 is mounted on a double-walled quartz pipe 24 through which a liquid or gas-like cooling medium is fed; the cooling medium being fed through a central pipe 25 directly to the lower side of cooling bottom plate 6 and discharged from there through the double wall.

EXAMPLE 1

A device as shown in FIG. 1 was used. The outer cylindrical crystallization chamber 1 had a cross section of 49 mm and a height of 50 mm and an inner square cross section of $30 \times 30$ mm with slightly rounded edges ($r = 2$ mm). The vertically movable bottom plate 6 had a thickness of 5 mm and was made, as was the crystallization chamber, of graphite. Furthermore, the graphite parts were protected by immersing the parts into a protective melt made of even parts of calcium silicate ($CaSiO_3$) and calcium fluoride ($CaF_2$).

From loading or charging device 12, as shown in FIG. 1, which was made of graphite, silicon granulate with a granule size of 0.4 to 4 mm was admixed with about 5% by weight of $CaSiO_3.CaF_2$ and transferred into the crystallization chamber by slightly lifting and turning stopper rod 18. This material was continuously melted in the crystallization chamber.

After a liquid deposit had formed in the crystallization chamber, the induction heating element was so adjusted that a temperature of about 1450° C. prevailed at the upper edge of the chamber, which temperature dropped to 1350° C. at the bottom of the chamber. The silicon started to crystallize in a rod-shaped manner on the bottom plate 6 which was mounted on a quartz pipe 7. The bottom plate was moved downwardly with a speed at the start of 10 mm/min to about 25 mm/min. The molten deposit was adjusted to about 10 mm by means of recharging during the crystal growing process. After about 35 minutes the test was interrupted. The result was a silicon rod with a length of 700 mm and a cross section of $30 \times 30$ mm. The rod had a columnar structure made of monocrystalline crystal zones with a preferential orientation (of the 111-direction).

EXAMPLE 2

900 g pre-purified silicon granulate with a content of 10 ppm boron and 1 ppm phosphorus were melted in a pipe-like crystallization chamber in accordance with FIG. 2, made of $CaSiO_3.CaF_2$ impregnated graphite and having an outside diameter of 180 mm, a height of 150 mm, and a square inner cross section of $100 \times 100$ mm$^2$ with slightly rounded corners ($r = 2$ mm). During melting of the silicon granulate, the heat capacity of the induction heating coil was so adjusted that a seed crystal plate made of silicon having a columnar structure was melted onto the bottom plate. The bottom plate had a height of 10 mm and was also made of graphite and, with exception of the recess for the seed plate having a size of $100 \times 100$ mm$^2$, was heat-insulated therebelow.

By a slow reduction of the temperature to about 1350° C. at the lower end of the crystallization chamber the columnar-like crystal growth which was started by the seed crystal continued growth due to the solidifying silicon. The silicon rod was drawn with a speed of about 20 mm/min, and was passed through immediately adjacent and subsequent heating zone of about 1350° to 1200° C., wherein it was tempered tension free. At the same time, this resulted in isotherms which were flat, even at further distances away from the crystallization front and which were almost perpendicular with respect to the drawing zone. After running through the subsequent heating zone which was effective on a rod length of about 15 cm, the silicon rod was further cooled down by applying nitrogen which was blown through a set of jets which were concentrically positioned around the rod.

A pre-purified melt of liquid silicon with a content of 10 ppm boron and 1 ppm phosphorous and about 5% by weight of $CaSiO_3.CaF_2$ were continuously added in such a quantity that a silicon melt of about 10 mm height was maintained in the crystallization chamber. This material was fed through a charging device shown in FIG. 1 made of melt protective impregnated graphite ($CaSiO_3.CaF_2$). This crucible had a capacity of about 20 liters of silicon melt and 5% by weight of protective melt. Due to the impregnation of this graphite crucible, as well as the stopper rod which was also made of graphite, with calcium silicate-calcium fluoride, it was possible to obtain a repeated closing and reopening of the bottom discharge due to the reaction bound silicon carbide; this would not be the case with non-impregnated graphite parts.

After the silicon rod had reached a length of 1000 mm with a cross-sectional face of $100 \times 100$ mm$^2$, the additional charging was interrupted, the melt above the crystal rod was frozen and the rod was removed from the drawing apparatus. After again pushing the bottom plate upwardly together with a new seed plate, a second silicon rod was made in the crystallization chamber in the same manner. Before making further rods the emptied recharging crucible was replaced by a second freshly-filled crucilbe. Subsequently the silicon rods were cut in discs of 400 mm thickness and were further processed into the solar cells in a known conventional manner.

While several embodiments of the invention have been shown and described, it will be obvious that many modifications and changes may be made thereunto, without departing from the spirit and scope of the invention.

What is claimed is:

1. A method for making silicon rods having a columnar structure made of monocrystalline crystal zones having a preferential crystallographic orientation, comprising the steps of:

feeding silicon from a silicon reservoir into a crystallization chamber having an interior horizontal dimension corresponding to at least to the cross-sectional dimension of the rod to be made and having a vertically movable support base on which said silicon fed to said chamber rests;

providing an intermediate protective melt between the silicon and the inner wall of said crystallization chamber so as to avoid direct contact therebetween, said protective melt being made of alkaline earth fluorides in an admixture with 30 to 90 mole percent alkaline earth silicates, said protective melt having a melting point below the melting point of silicon; and effecting the solidification of said silicon in said crystallization chamber by subjecting the same to a vertical temperature gradient which produces an oriented crystal growth in the solidifying silicon, said silicon being fed to said chamber in such a quantity that a molten deposit is maintained above the solidifying silicon during its crystal growth under the influence of said temperature gradient, the weight quantity of said molten deposit being maintained at 0.1 to 5 times that of the silicon which crystallizes in a downward direction per minute.

2. The method according to claim 1, wherein prior to said solidification step a cooled plate-like seed crystal is positioned beneath the silicon to be solidified, which crystal has a horizontal dimension substantially corresponding to the desired cross-sectional dimension of the silicon rod to be made.

3. The method according to claim 1 or 2, additionally including the step of cooling the solidified silicon rod during the crystal growth thereof.

4. The method according to claim 1 or 2, additionally including the step of drawing off the crystallized silicon rod from said crystallization chamber.

5. The method according to claim 1, wherein said protective melt is a melt made of calcium fluoride in a mixture with 40 to 60 mole percent calcium silicate.

6. The method according to claim 1, wherein said feeding step is carried with a crucible which is positioned above said crystallization chamber having an opening in the bottom thereof which can be at least partially closed by means of a rotatable vertically movable stopper rod disposed above said opening which has a conically-tapered end.

7. The method according to claim 1, wherein said silicon is fed continuously from said silicon reservoir to said chamber.

8. The method according to claim 1, wherein said silicon is fed in a cyclical fashion from said silicon reservoir to said chamber.

* * * * *